United States Patent

Quirmbach

[11] Patent Number: 6,147,562
[45] Date of Patent: Nov. 14, 2000

[54] APPARATUS FOR SYNCHRONIZING MASTER AND SLAVE PROCESSORS

[75] Inventor: Gerhard Quirmbach, München, Germany

[73] Assignee: Siemens Aktiengesellschaft, Munich, Germany

[21] Appl. No.: 09/308,947

[22] PCT Filed: Nov. 4, 1997

[86] PCT No.: PCT/EP97/06080

§ 371 Date: May 26, 1999

§ 102(e) Date: May 26, 1999

[87] PCT Pub. No.: WO98/24185

PCT Pub. Date: Jun. 4, 1998

[51] Int. Cl.[7] .............................. H03L 7/06; H03L 7/07; H03L 7/085
[52] U.S. Cl. ............................... 331/14; 331/11; 331/12; 331/17; 331/25; 327/147; 327/298
[58] Field of Search .................. 331/10–12, 14, 331/17, 18, 25; 327/147–150, 298

[56] References Cited

U.S. PATENT DOCUMENTS

| | | | |
|---|---|---|---|
| 4,511,859 | 4/1985 | Dombrowski | 331/111 |
| 5,216,387 | 6/1993 | Telewski et al. | 331/11 |
| 5,739,727 | 4/1998 | Lofter et al. | 331/11 |

FOREIGN PATENT DOCUMENTS

| | | |
|---|---|---|
| 0 139 126 | 5/1985 | European Pat. Off. . |
| 0 175 888 | 4/1986 | European Pat. Off. . |
| 0 262 481 | 4/1988 | European Pat. Off. . |

*Primary Examiner*—David Mis
*Attorney, Agent, or Firm*—Hill & Simpson

[57] ABSTRACT

A master and slave arrangement of processors includes a clock signal synchronization apparatus. The clock signals of two (processor) assemblies in micro-synchronous operation are only allowed to exhibit an extremely slight phase difference. A system clock signal is generated by a voltage controlled oscillator, which is fed by phase detectors with a filter at the output of each phase detector. Switches are provided between the filter output and the voltage controlled oscillator input. The phase detectors compare the system clock signal and a reference clock signal. A delay is provided at the input of one phase detector.

3 Claims, 4 Drawing Sheets

APPARATUS FOR SYNCHRONIZING MASTER AND SLAVE PROCESSORS

BACKGROUND OF THE INVENTION

1. Field of the Invention

The present invention related generally to a synchronization unit for synchronizing two system clocks in an electronic device, such as a switching device.

2. Description of the Related Art

For satisfying increased operational dependability in switching technology, it is demanded that two processor assemblies (one of the two is a master and the other is a slave) work redundantly. This can be achieved by micro-synchronous operation, whereby the slave synchronizes to the master. The master in turn synchronizes to an external reference clock. Given an outage of the external reference clock, the (clock) master must continue to work for example, in a (hold over mode) and the slave must continue to synchronize to the master.

The critical demand for micro-synchronous operation is that the phase difference between the two processor assemblies should lie within an extremely slight time difference (for example, 5 ns).

Synchronization methods wherein phase information are exchanged between the two processor assemblies can be imagined for satisfying the demand. In these methods, however, falsifications of the phase information can occur due to different gate running times and reflections on the connecting lines between the two assemblies. This leads to operating instabilities.

The European patent document EP 0 175 888 A discloses a synchronization means using a phase comparator with each incoming channel to compare the clock phase of the incoming signal and a local oscillator. The phase comparator of the active unit generates a signal to control the oscillator to maintain its output in phase with incoming signal. The oscillator is a voltage controlled quartz oscillator.

SUMMARY OF THE INVENTION

The present invention is based on the object of providing a synchronization portion of an assembly that meets the demand for collaboration with the synchronization portion of a partner assembly.

This object is achieved by a synchronization portion of an assembly that generates the system clock of the assembly, whereby it synchronizes the system clock to one of several existing reference clocks, including, a) a VCO that generates the system clock of the assembly depending on a signal applied to its control input;

b) an arrangement that includes a phase detector with a following filter and is present respectively once per reference clock signal, whereby a respective reference clock signal is applied to one input of a phase detector and the system clock is respectively applied to the other input;

c) an operating control that controls the switches following the filters such that respectively one of the output signals of the filters is through-connected to the control input of the VCO, the operating control controls further switches such that, given the arrangement wherein the output signal of the filter is not through-connected to the input of the VCO, the output of the phase detector is switched to tri-state; the output signal is fed back to the one filter input; and the decoupled signal of the control input of the VCO is applied to the other filter input.

One embodiment of the invention provides a delay unit that delays the system clock before the input to the phase detector by the running time difference between reference clock and system clock which makes it possible to switch the mode of a processor assembly (for example, from clock master to clock slave or vice versa) without leaving the micro-synchronous operation (slave/slave is not possible). The switching is thus possible during micro-synchronous operation.

BRIEF DESCRIPTION OF THE DRAWINGS

An exemplary embodiment of the invention is explained in greater detail below with reference to the drawings.

DETAILED DESCRIPTION OF THE PREFERRED EMBODIMENTS

Figure 1:
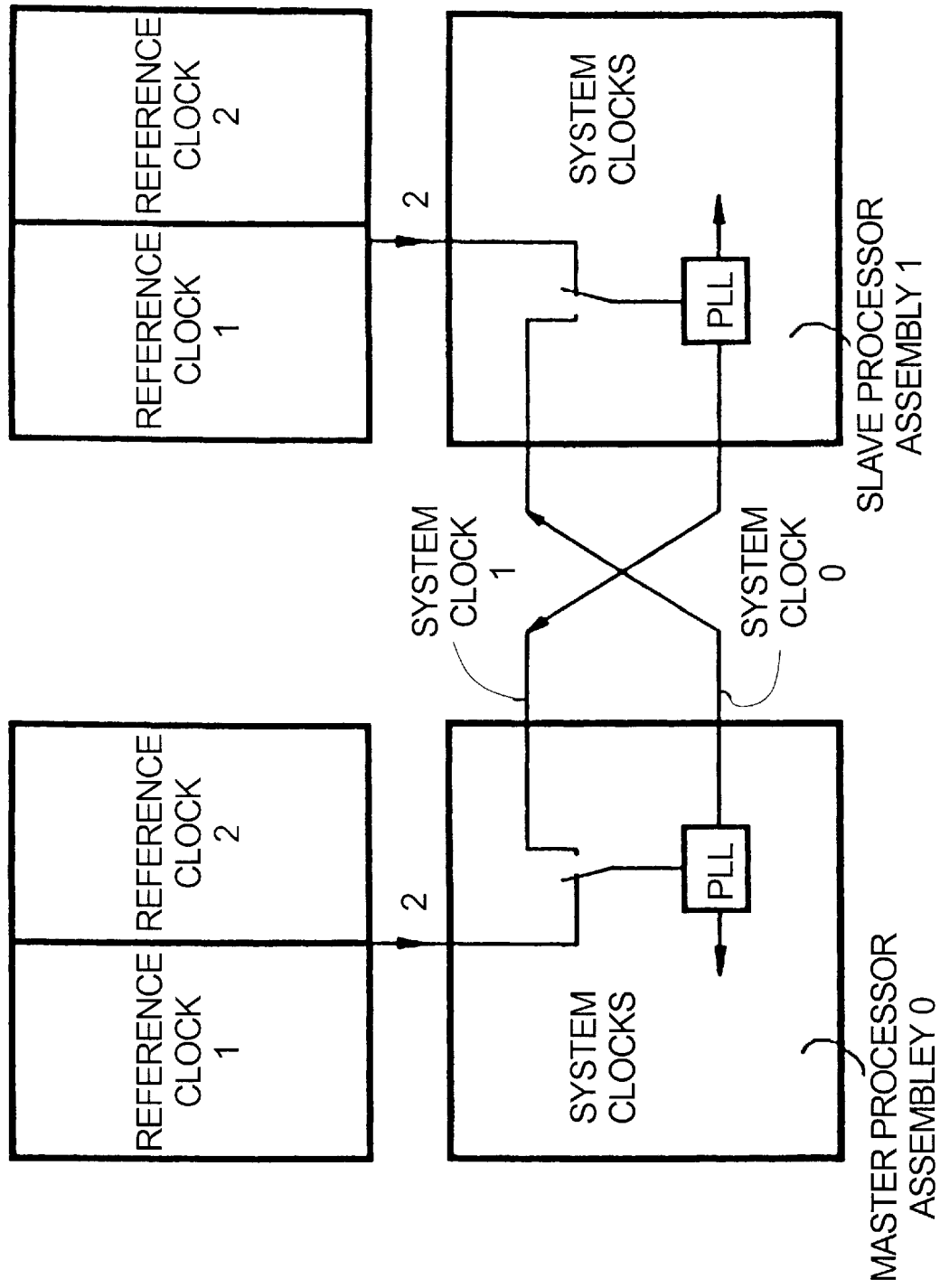
FIG. 1 is a block diagram showing the synchronization system of the present invention in a master/slave processor arrangement.

FIG. 1 shows the basic structure of the mutual clock synchronization. According to the illustrated structure, a respective PLL is contained in an assembly, a switch that serves for switching between the operating modes "Master" and "Slave" of an assembly being present at the input thereof.

Only one processor assembly is synchronized to the external reference clock, namely the master assembly. The other processor assembly which is referred to as the "Slave Assembly" synchronizes to the Master Processor assembly with a PLL (Phase Locked Loop). The Slave Processor assembly runs with exactly the same frequency and phase as the Master Processor assembly.

Figure 2:
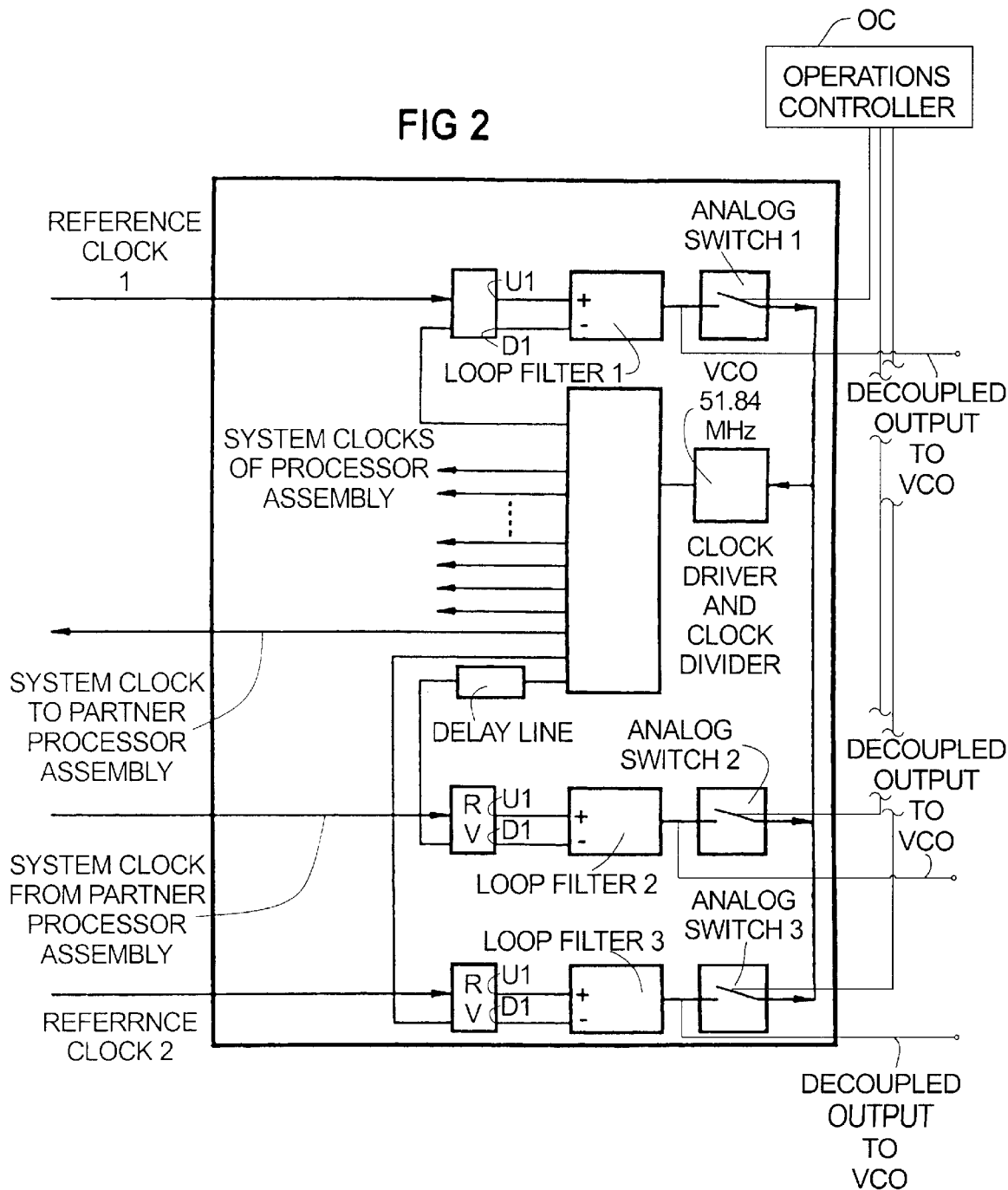
FIG. 2 is functional block diagram of the synchronization portion.

FIG. 2 shows the basic structure of an inventive synchronization means. The synchronization means comprises a voltage controlled oscillator VCO that generates the system clock signal of the assembly dependent on a signal adjacent at its control input which here is a (set voltage input), an arrangement that comprises a phase detector RV with a following filter (a loop filter) and that is provided for each reference clock, whereby a respective reference clock signal is at the one input R of a phase detector and the system clock is respectively adjacent at the other input V, an operations controller (OC; can, for example, be realized by the processor of the assembly and/or by a corresponding logic) unit that controls the switches following the filters such that respectively one of the output signals of the filters is through-connected to the control input of the VCO, a delay unit (shown as a delay line) that delays the system clock preceding the input to the phase detector by the running time difference between the reference clock and the system clock.

The selection of the reference clocks by (analog) switches at the set voltage input of the VCO (see FIG. 2) is for the following reason. Due to the demand of a maximum 5 ns phase difference between the Master and the Slave, no further running time of any switches whatsoever for the selection of an external reference clock is allowed preceding the input of the phase comparator of the "Partner Processor Assembly" other than the line running time (the time difference between the minimum and the maximum running time of such a switch, namely, deteriorates the worst case phase difference between the Master assembly and the Slave assembly). A separate phase comparator is therefore inventively present for each reference clock.

The advantage of the structure shown in FIG. 2 compared to the arrangement shown in FIG. 1 wherein the switches are arranged at the input of the PLLs is thus comprised therein that no further running time of any switches whatsoever for the selection of an external reference clock is added to the phase difference.

If the line running time makes an unacceptable difference with respect to the demand made of the phase time difference, this can be compensated with a lead of the PLL. To that end, a delay unit (which here is a delay line) is inserted preceding the comparison input V of the phase detector of the Partner Processing Assembly that delays the system clock preceding the input to the phase detector by the running time difference between the reference clock on the Master assembly and the system clock of the Slave assembly. Given employment of such a delay unit, what one thus achieves is that the reference clock and system clock (given selection of a PLL that controls the phase difference at the phase detector input to zero) are practically equiphase independently of the running time difference.

In addition to controlling the switches shown in FIG. 2, the operating control also controls further switches (shown in FIGS. 3–5) such that, given a filter whose output signal is not through-connected to the input of the VCO, the output signal is fed back to the one filter input and the decoupled signal of the control input of the VCO is applied to the other filter input. As a result thereof, the output signal of a passively co-running loop filter is constantly regulated to the same level as that of the active arrangement. An optimum transient response of the PLL phase skip thereby derives after the switching to a different reference clock (external reference clock or system clock of the Partner assembly)! A mode switching and/or a change of the external clock source is thus possible without deterioration of the micro-synchronous operation.

The inventive clock synchronization works without exchange of the phase information. This is achieved in that the line running time between the two processor assemblies is compensated with a lead of the PLL.

The selected PLL has a zero phase difference at the input of a phase detector (PD) between the local clock and the external reference clock.

For example, the phase detector PD-Type 4 from Roland Best, Theorie und Anwendung des Phase-locked Loops, ISBN 3-85502-132-5 can be taken as a phase detector and can be easily modified so that it synchronizes to the positive signal edge and the two outputs can be switched to tri-state. The advantage of this type is:

control to zero phase difference phase and frequency-sensitive behavior independence from supply voltage and temperature easy realizability of the three phase comparators in one PLD (Programmable Logic Device)

great range of theoretical ±2π. This is necessary since the phase is not lost given switching to a different reference clock, i.e. synchronization is carried out to the original signal edge when switching back. This is necessary in order to prevent data loss at the synchronous TSI interface.

Loop Filter:

Three loop filters having the following properties are realized:

A slow transient response is required when switching to an external reference. The modulation of the set voltage input of the VCO must therefore be small (small amplification) at the input phase skip.

A fast transient response is required when switching to the Partner processor assembly. The modulation of the set voltage input of the VCO must therefore be great (great amplification) at the input phase skip.

Different frequencies at the input of the three phase comparators, finally, likewise require correspondingly different dimensionings of the loop filters.

Figure 3:
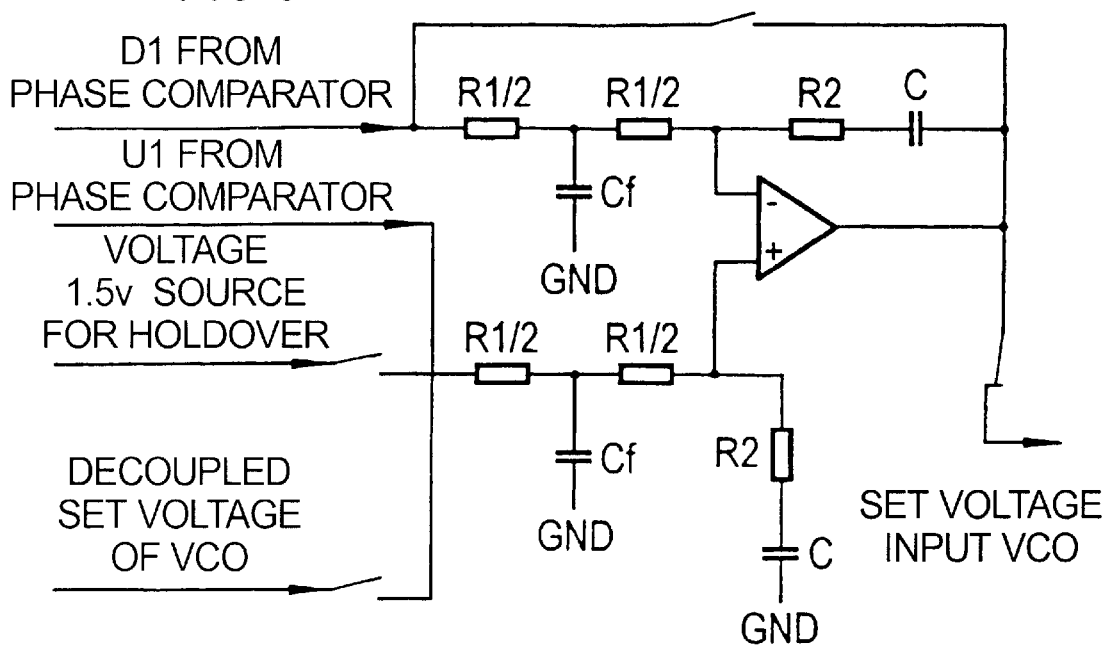
FIG. 3 is a circuit diagram showing the activated operating mode.
Figure 4:
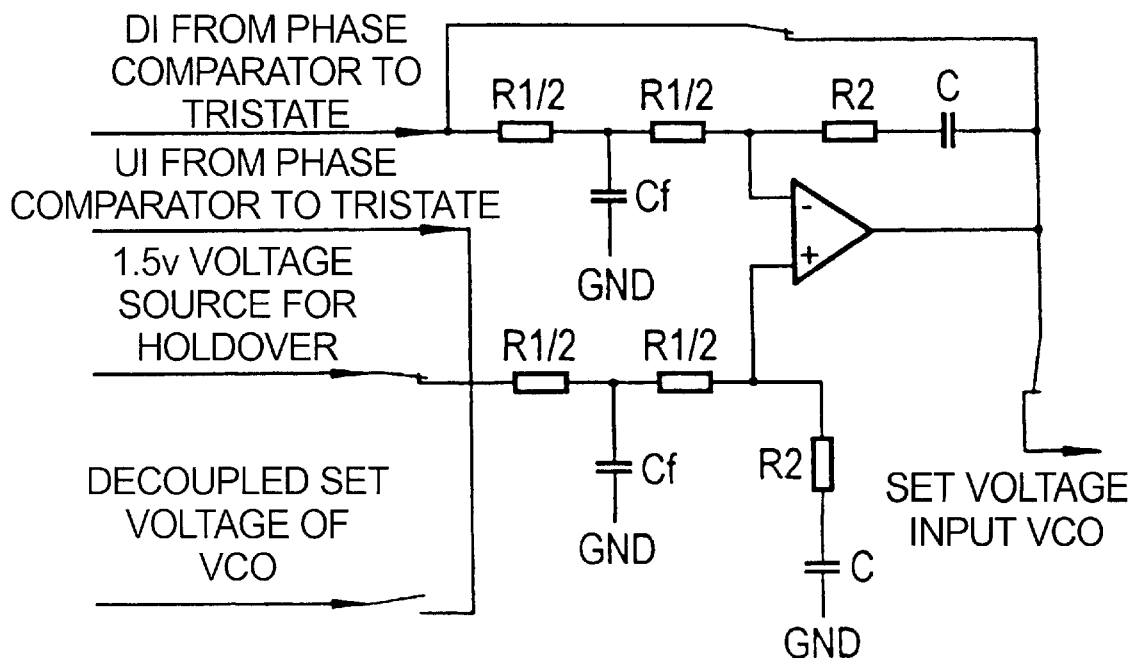
FIG. 4 is a circuit diagram showing the standby mode.
Figure 5:
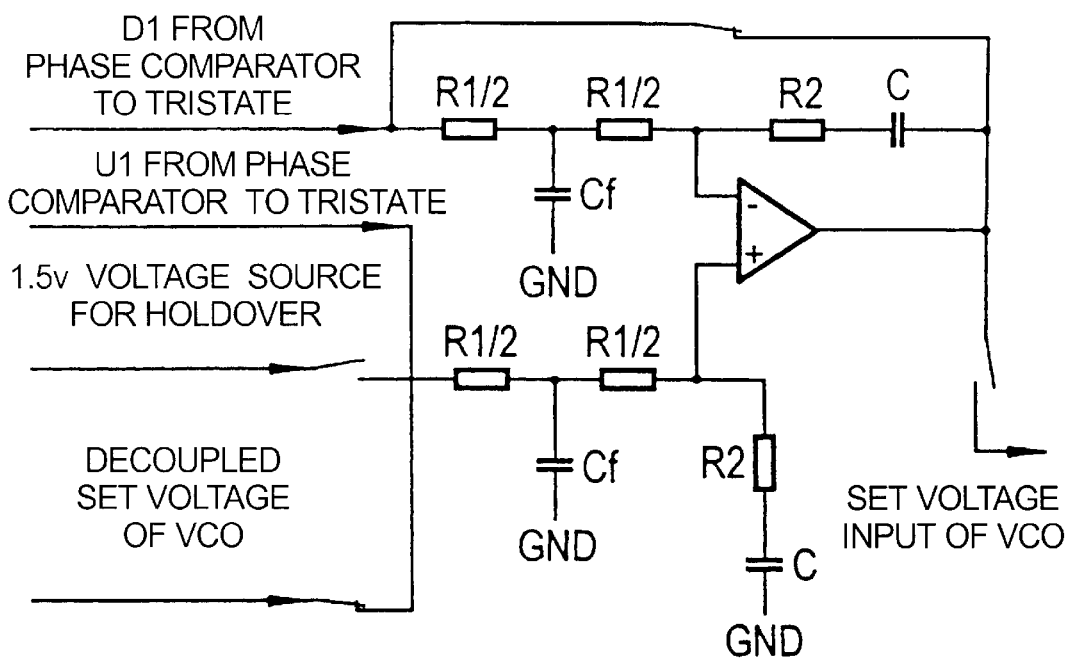
FIG. 5 is a circuit diagram showing the circuit in the monitor mode.

In order to prevent the loop filter output from leaving the range of the operating voltage and proceeding into saturation (detent of the output voltage has a negative influence on the transient response of the PLL), there are three operating modes for each loop filter, these being shown in FIGS. 3–5 and being controlled by the operating control with the assistance of the illustrated switches.

FIG. 3 shows the activated operating mode:
In this operating mode, the PLL control circuit is closed (D1 and U1 are not applied to tri-state). The processor assembly can thereby be in Master mode or Slave mode.

FIG. 4 shows the holdover operating mode:
In this operating mode, the processor assembly is in the Master mode and works without an external reference. In this operating mode, the output of the loop filter amounts to 1.5 V.

FIG. 5 shows the monitor VCO operating mode:
In this operating mode, the output voltage value of the loop filter corresponds to the voltage value at the VCO set voltage input. As a result thereof, the correct output level is assured at the VCO set voltage input at the moment of switching to the activated mode (PLL control circuit) (an output level at the positive or negative detent of the operational amplifier would result in a frequency skip that could lead to the upward transgression of the 5 ns maximum phase difference demand between two processor assemblies).

Although other modifications and changes may be suggested by those skilled in the art, it is the intention of the inventors to embody within the patent warranted hereon all changes and modifications as reasonably and properly come within the scope of their contribution to the art.

What is claimed is:

1. A synchronization apparatus of an assembly that generates a system clock signal which is synchronized to one of a plurality of reference clocks, comprising:

a voltage controlled oscillator having a control input and that generates the system clock signal of the assembly dependent on a signal at said control input;

an arrangement including phase detectors each having two inputs and an output, a respective reference clock signal applied to one of said two inputs of each of said phase detectors and the system clock signal being applied to the other of said two inputs;

filters having inputs connected to said outputs of said phase detectors and having outputs;

switches connected at said outputs of said filters to connect signals output from said filters to said control input of said voltage controlled oscillator;

an operating controller connected to said switches that controls said switches such that respectively one of the output signals of the filters is through-connected to the control input of the VCO, and further switches connected to said operating controller which controls said further switches such that, given a case wherein the output signal of a respective one of the filters is not through-connected to the input of the VCO, the output of a respective on of the phase detectors is switched to tri-state;

the output signal is fed back to a first input of said respective one of said filters;

and a decoupled signal of the control input of the VCO is applied to a second input of said respective one of said filters.

2. A synchronization unit according to claim 1, further comprising:

a delay unit that delays the system clock before input to a phase detector of the phase detectors by a running time difference between the reference clock of the phase detector of the phase detectors and the system clock.

3. A method for synchronizing clock signals in a master/slave arrangement, comprising the steps of:

generating a system clock signal depending on an input control signal;

providing reference clock signals;

detecting a phase difference between each of the reference clock signals and the system clock signal to obtain phase difference signals;

filtering said phase difference signals with a filter to obtain filter signals;

selectively connecting one of said filter signals as said input control signal;

providing a tri-state output of said phase difference detecting step;

feeding said filter signals of said filtering step back to a further filter to synchronize said system clock to one of a plurality of reference clocks.

* * * * *